(12) United States Patent
Jaffe

(10) Patent No.: US 7,239,357 B2
(45) Date of Patent: Jul. 3, 2007

(54) DIGITAL IF DEMODULATOR WITH CARRIER RECOVERY

(75) Inventor: Steven T Jaffe, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 333 days.

(21) Appl. No.: 10/448,062

(22) Filed: May 30, 2003

(65) Prior Publication Data
US 2003/0197810 A1    Oct. 23, 2003

Related U.S. Application Data

(63) Continuation-in-part of application No. 09/739,349, filed on Dec. 15, 2000.

(60) Provisional application No. 60/401,043, filed on Aug. 6, 2002.

(51) Int. Cl.
*H04N 5/455* (2006.01)
(52) U.S. Cl. .................. 348/726; 348/555; 348/725; 348/738
(58) Field of Classification Search ............... 348/726, 348/725, 729, 731, 735, 736, 737, 738, 555, 348/554, 484, 482
See application file for complete search history.

(56) References Cited

U.S. PATENT DOCUMENTS

| | | | |
|---|---|---|---|
| 5,031,233 A | 7/1991 | Regan | |
| 5,715,012 A | 2/1998 | Patel et al. | |
| 5,737,035 A | 4/1998 | Rotzoll | |
| 6,005,640 A * | 12/1999 | Strolle et al. | 348/726 |
| 6,147,713 A * | 11/2000 | Robbins et al. | 348/555 |
| 6,233,295 B1 * | 5/2001 | Wang | 375/364 |

(Continued)

OTHER PUBLICATIONS

Poole, S., Surface, G., Singh, B., Dyer, N., "A CMOS Subscriber Line Audio Audio Processing Circuit Including Adaptive Balance," IEEE International Symposium on Circuits and Systems, Finland, Espoo, vol. 2 of 3, Jun. 7-9, 1988, pp. 1931-1934.

*Primary Examiner*—Trang Tran
(74) *Attorney, Agent, or Firm*—Sterne, Keesler, Goldstein & Fox P.L.L.C.

(57) ABSTRACT

A digital IF demodulator receives and demodulates an analog IF input signal to produce a digital audio signal and a digital video signal. The digital IF demodulator includes an A/D converter, a first digital complex mixer, a second digital complex mixer, and various digital filters. The first digital complex mixer receives the output of the A/D converter and down-converts the output of the A/D converter to baseband. Additionally, the picture carrier is recovered from the output of the first digital complex mixer, and fed back to a direct digital synthesizer to control the tuning accuracy of the first digital complex mixer. More specifically, a feedback loop is formed to so that the picture carrier is down-converted to DC so as to control the tuning accuracy of the first digital complex mixer. The complex output of the first complex mixer is further processed using Nyquist filtering and other filtering to recover the digital video signal. The digital audio signal is recovered by further processing the output of the first digital complex mixer. With the picture carrier located at DC, the audio signal is shifted off DC by approximately 4.5 Mhz. A second complex mixer down-converts the output of the first digital complex mixer so that the audio signal at 4.5 MHz is down-converted to baseband. After filtering and demodulation, the digital audio signal is recovered.

39 Claims, 6 Drawing Sheets

U.S. PATENT DOCUMENTS 6,445,726 B1 * 9/2002 Gharpurey ................ 375/136
6,476,878 B1 * 11/2002 Lafay et al. ................ 348/738
6,738,098 B1 * 5/2004 Hutchinson ................ 348/691

* cited by examiner

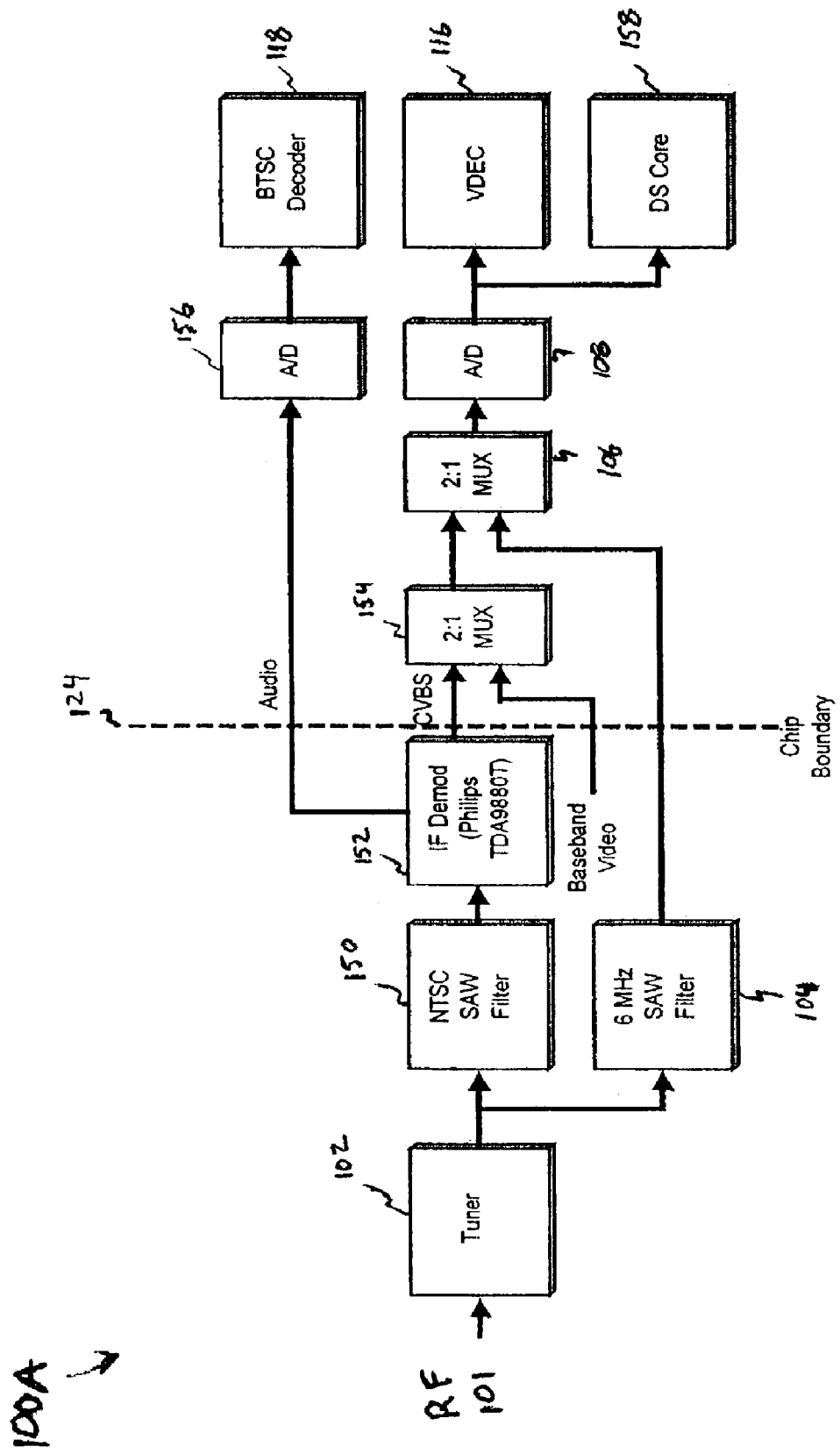
FIG. 1A. (CONVENTIONAL)

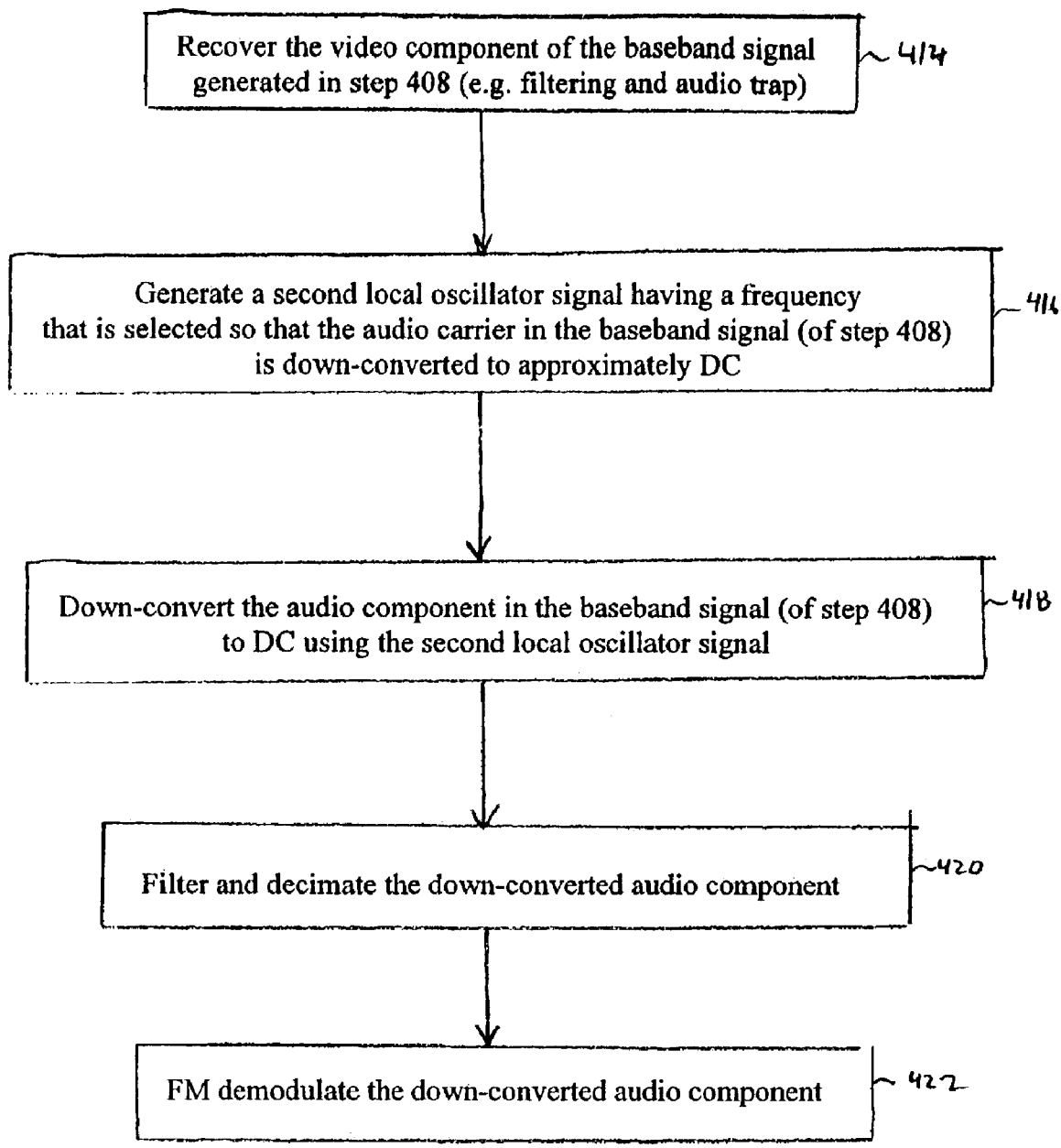

US 7,239,357 B2

DIGITAL IF DEMODULATOR WITH CARRIER RECOVERY

CROSS-REFERENCE TO RELATED APPLICATIONS

This application is a Continuation-In-Part of U.S. Non-Provisional Application entitled "Digital IF Demodulator for Video Applications," Ser. No. 09/739,349, filed Dec. 15, 2000, which is incorporated by reference herein in its entirety; and this application also claims the benefit of U.S. Provisional Patent Application No. 60/401,043, filed on Aug. 6, 2002, which is incorporated by reference herein in its entirety.

BACKGROUND OF THE INVENTION

1. Field of the Invention

The present invention is related to a digital IF demodulator, and more specifically to a digital IF demodulator for processing television signals.

2. Background Art

Various analog IF demodulators are used to process television signals. These analog approaches require very accurate filter implementations that often require expensive and time consuming tuning of individual units. To properly recover the video, the shape of the Nyquist filter in the receiver needs to be defined accurately, and the tuner needs to accurately center the picture carrier exactly in the middle of the Nyquist slope of the IF filter, which requires high precision phase lock loops in the tuner. Conventionally, this required separate preprocessing filters for NTSC analog television signals and digital television signals, as well as a separate IF demodulator for the NTSC analog signal. Thus, what is needed is a digital IF demodulator that lessens the filtering requirements on the RF tuner.

It is also desirable to integrate the IF demodulator onto a single low cost silicon substrate fabricated with the low cost Complementary Metal Oxide Semiconductor (CMOS) process. Such integration reduces part count, cost, and size. Complete integration into a single, low cost substrate has been difficult to achieve because the limitations of the designed circuitry often call for external components. Such external circuitry typically requires components having large values of capacitance and inductance that do not facilitate integration into a single substrate.

Thus, what is needed is a digital IF demodulator that may be completely integrated onto a single silicon substrate. Such a demodulator would minimize or eliminate external circuitry, and allow efficient and economical integration and fabrication on a single silicon substrate.

BRIEF SUMMARY OF THE INVENTION

The present invention includes a digital IF demodulator that receives and demodulates an analog IF input signal to produce a digital audio signal and a digital video signal. In embodiments, the analog IF input signal is a television signal or channel that has been down-converted from RF. The digital IF demodulator includes an A/D converter, a first digital complex mixer, a second digital complex mixer, and various digital filters. The A/D converter receives the analog input signal and converts it to digital. The first digital complex mixer receives the output of the A/D converter and down-converts the output of the A/D converter to baseband. Additionally, the picture carrier is recovered from the output of the first digital complex mixer, and fed back to a direct digital synthesizer to control the tuning accuracy of the first digital complex mixer. More specifically, a feedback loop is configured so that the picture carrier is down-converted to DC so as to control the tuning accuracy of the first digital complex mixer. The complex output of the first complex mixer is further processed using Nyquist filtering and other filtering to recover the digital video signal. Such filtering may be accomplished using digital signal processing techniques. The digital audio signal is recovered by further processing the output of the first digital complex mixer.

When the picture carrier is down-converted to DC, the audio signal is offset from DC by approximately 4.5 Mhz (or by some other amount such as 5.5 MHz, 6.0 MHz, or 6.5 MHz depending on the standard used). A second complex mixer down-converts the output of the first digital complex mixer so that the audio signal at 4.5 MHz is down-converted to baseband. After filtering and demodulation, the digital audio signal is recovered.

BRIEF DESCRIPTION OF THE DRAWINGS/FIGURES

The present invention is described with reference to the accompanying drawings. In the drawings, like reference numbers indicate identical or functionally similar elements. Additionally, the left-most digit(s) of a reference number identifies the drawing in which the reference number first appears.

FIG. 1A illustrates a conventional television receiver having an RF tuner, a National Television Standards Committee (NTSC) Surface Acoustic Wave (SAW) Filter, an IF SAW filter, an analog IF demodulator, two Analog-to-Digital Converters, a BTSC decoder a Video Decoder (VDEC) and a Digital Signal Processing Core.

Figure 2:
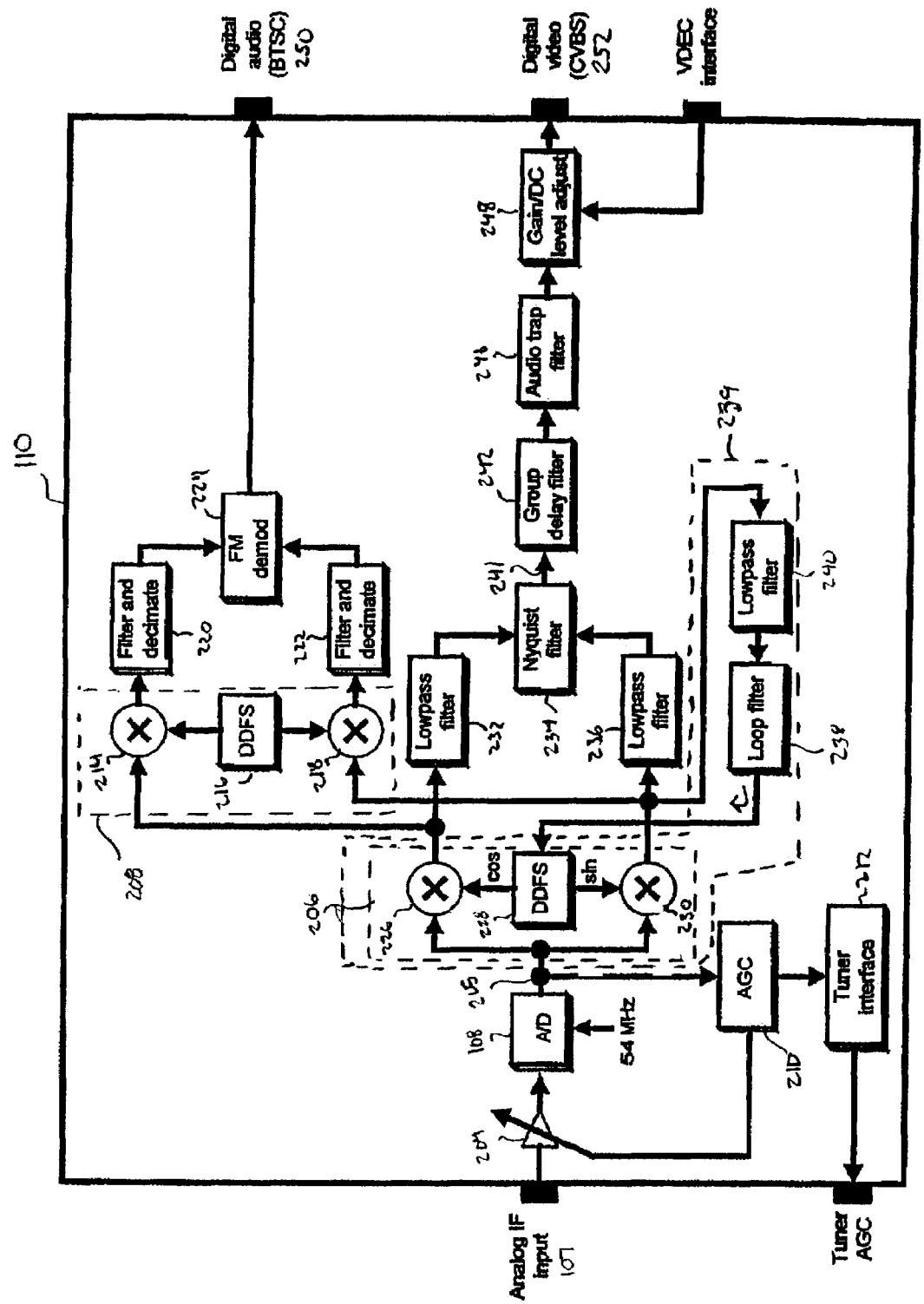

FIG. 2 further illustrates the digital IF demodulator according to embodiments of the present invention.

Figure 3:
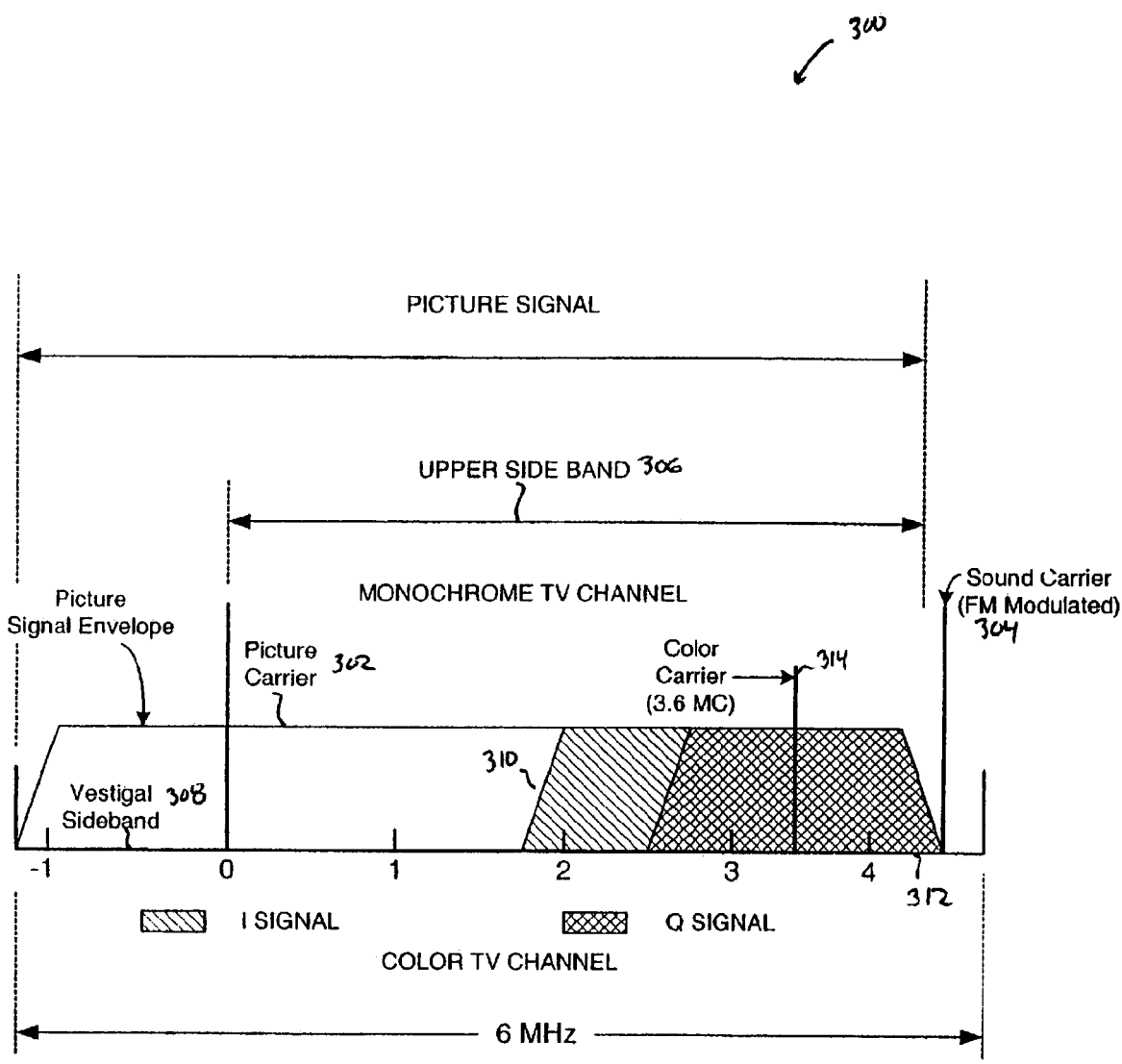

FIG. 3 illustrates the frequency spectrum of a TV channel with the picture carrier at 0 Hz (DC), and the sound carrier frequency shifted off DC by 4.5 MHz.

Figure 4A:
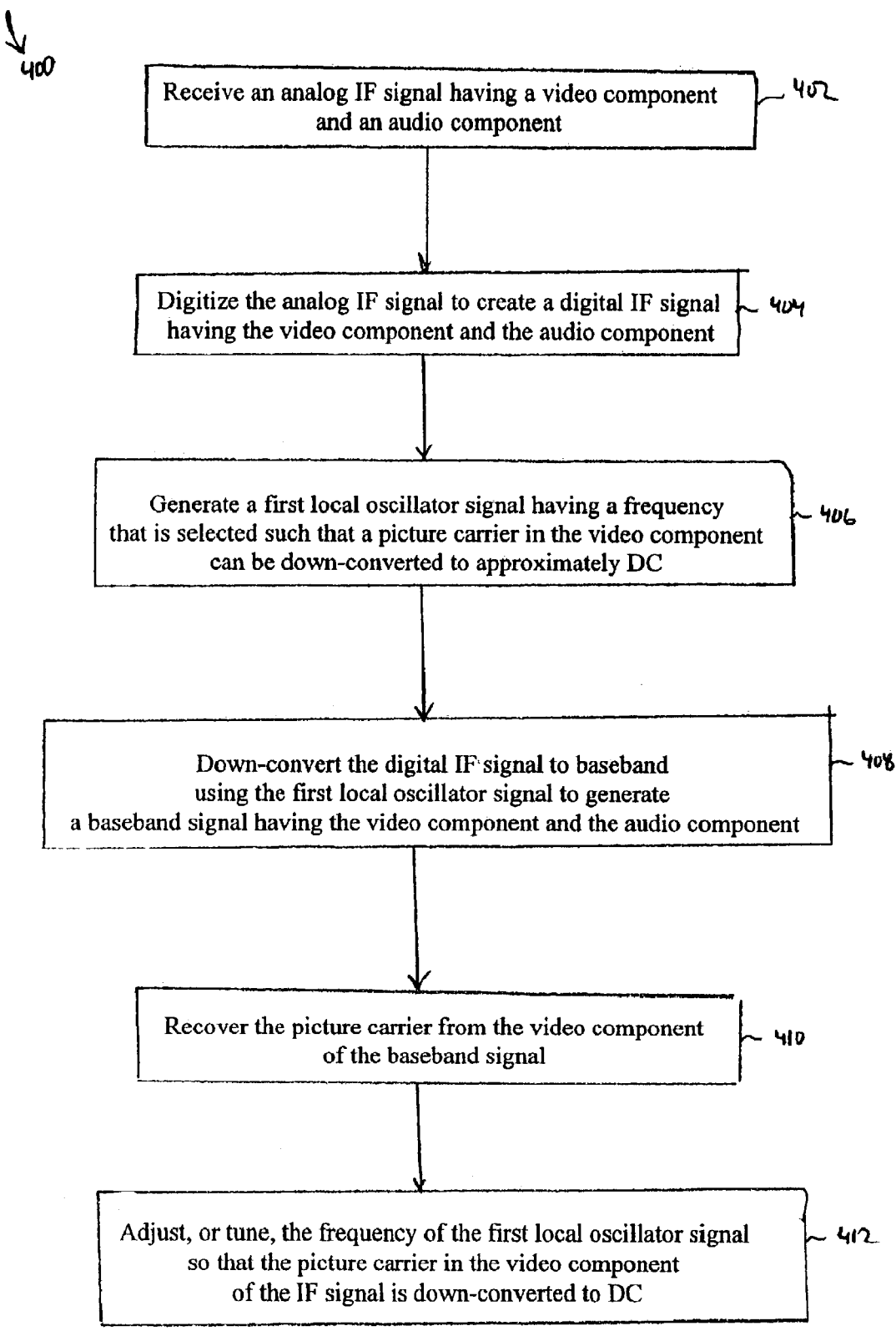

FIGS. 4A and 4B illustrate a flowchart 400 that further describes the operation of the IF demodulator according to embodiments of the invention.

DETAILED DESCRIPTION OF THE INVENTION

FIG. 1A illustrates a conventional television receiver 100A including an RF tuner 102, a National Television Standards Committee (NTSC) (or Phase Alternation Line (PAL); or Systeme Electronique Couleur Avec Memoir (SECAM)) surface acoustic wave (SAW) filter 150, an IF SAW filter 104, an analog IF demodulator 152, two analog-to-digital (A/D) converters 108, 156, a BTSC Decoder 118, a Video Decoder (VDEC) 116, and a digital signal processing core 158. Multiple SAW filters 104, 150 are needed to pre-process the plurality of signals that exist in today's television signals. For example, an NTSC signal requires a NTSC SAW filter 150 to pre-process the NTSC signal, and an analog NTSC IF demodulator 152. A 6 MHz SAW 104 is typically used to pre-process a digital television signal. In order to process both the analog video and analog audio, a separate A/D converters are required for each. The analog video and digital TV signals can be processed with the same A/D converter. After the signals are digitized, they are decoded by the BTSC decoder 118 for the audio signal and the VDEC 116 for the video signal. The digital TV signal is processed in the down stream core 158. Hereinafter, the term 'digital video signal' refers to a digitized version of an analog video signal.

Figure 1B:
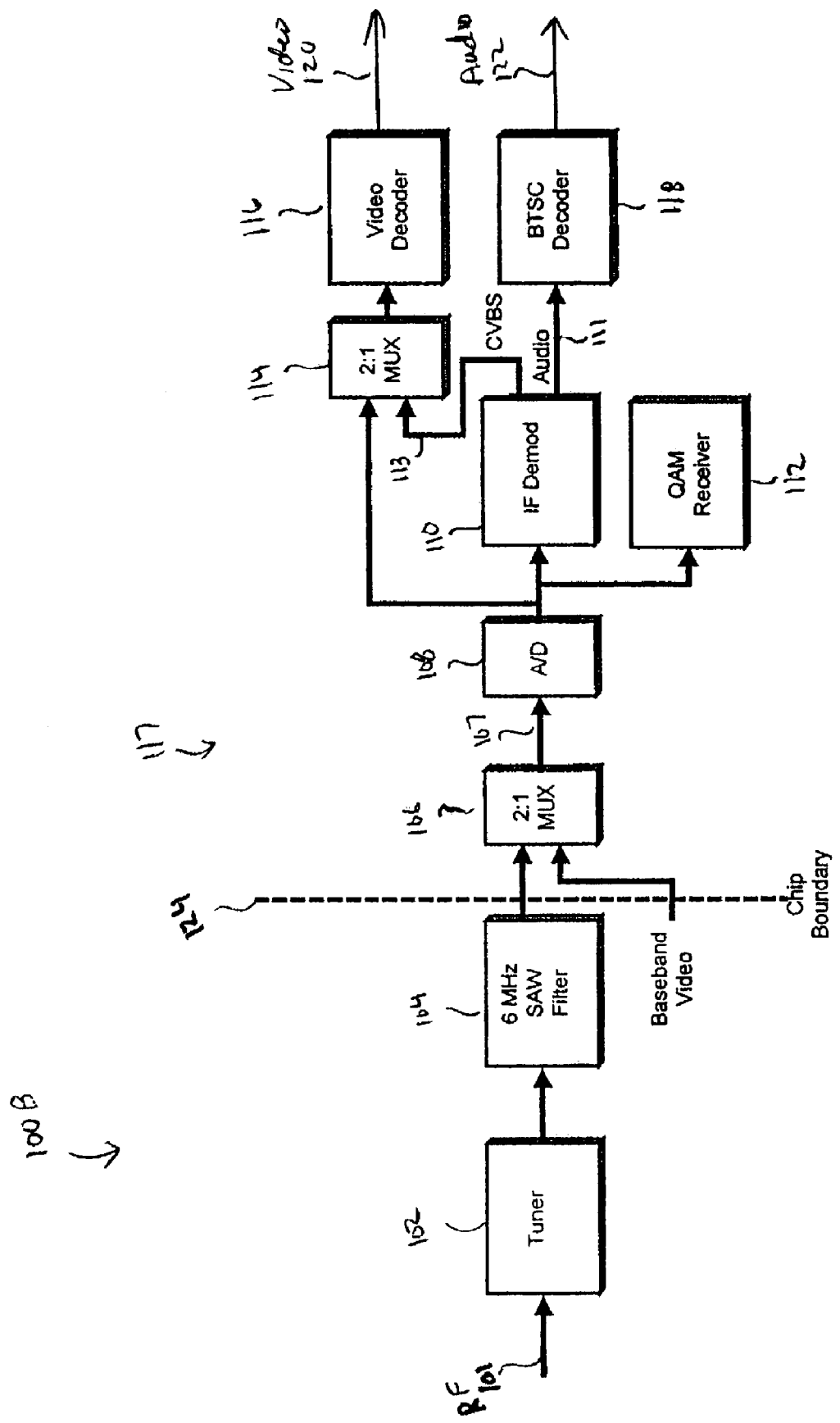
FIG. 1B illustrates a television receiver having an RF tuner, IF SAW filter, and a digital IF demodulator.

FIG. 1B illustrates a television receiver 100B implementing the present invention. Receiver 100B includes an RF tuner 102, an IF filter 104 (e.g. SAW filter), and a IF processor/demodulator 117. The IF processor 117 can be configured on a single semiconductor substrate, as indicated by the chip boundary line 124. The tuner 102 receives an RF input signal 101 having a plurality of channels, for example, TV channels that are spaced 6 MHz apart. The RF tuner 102 selects and down-converts a desired channel to an IF signal that is output from the tuner 102. For example, the IF signal can be at a frequency of 36 MHz, 44 MHz, or some other IF frequency. The SAW filter 104 receives the IF signal from the tuner 104 and filters the IF signal to remove any remaining unwanted channels. The tuner 102 can be implemented on a single substrate, as further described in "Digital IF Demodulator For Video Applications", Application No. 09/739,349, filed on Dec. 15, 2000, which is incorporated herein by reference.

The IF processor 117 receives the IF signal from the SAW filter 104, and demodulates the IF signal, to produce a digital video signal 120 and a digital audio signal 122, that carry for example TV programming or other information. The IF processor 117 includes a 2:1 multiplexer, an A/D converter 108, an IF demodulator 110, a QAM receiver 112, a 2:1 multiplexer 114, a video decoder 116, and a BTSC decoder 118. As indicated from the chip boundary 124, the IF processor 117 can be configured on a single substrate, such as for example a CMOS substrate.

The 2:1 multiplexer 106 in the IF processor 117 multiplexes the IF signal from the SAW filter 106 with any baseband video signal that may be present to produce an analog IF input signal 107 that is sent to the A/D converter 108. The A/D converter 108 digitizes the output of the 2:1 multiplexer 106. The IF demodulator 110 receives the digitized output from the A/D converter 108, and down-converts the A/D converter 108 output to produce a digital video signal 113 and a digital audio signal 111. The digital audio signal 111 can be a BTSC compatible digital audio signal, and the digital video signal 113 can be a composite video broadcasting signal (CVBS). The BTSC decoder 118 receives the digital audio output 111 from the IF demodulator 110 and generates a decoded audio output 122. The 2:1 multiplexer 114 receives the digital video output 113 from the IF demodulator 110 and multiplexes it with the output from the A/D converter 108. A video decoder 116 decodes the output of the 2:1 multiplexer to produce the video signal 120.

The IF processor 117 can also include a QAM receiver 112 to process an output of the A/D converter 108 that includes QAM data. In embodiments, the IF demodulator 110 and the QAM receiver 112 use common circuit elements.

IF demodulator 110 processes both an NTSC analog video signal (or a PAL signal or a SECAM signal), along with a digital television signal (e.g., a QAM television signal). Such flexibility simplifies the front end receiver requirements by unifying the signal path prior to the demodulator 110, thus reducing both cost and part count. The present invention thus eliminates the need for a separate NTSC SAW filter 150 (FIG. 1A), the NTSC IF demodulator 152, and the additional A/D converter 156 that are shown in FIG. 1A. The signal path before the chip boundary 124 is unified, thus simplifying the tuner output and filtering requirements.

FIG. 2 further illustrates the IF demodulator 110 that receives the analog IF input signal 107 and generates a digital audio signal 250 and a digital video signal 252 that is ready for baseband decoding by the decoders 116 and 118. The IF demodulator 110 includes a programmable gain amplifier (PGA) 204, the A/D converter 108, an AGC 210, a tuner interface 212, a first complex mixer 206, a second complex mixer 208, lowpass filters 232 and 236, a nyquist filter 234, filters 220 and 222, FM demodulator 224, a group delay filter 242, an audio trap 246, a DC level adjust 248, a loop filter 238, and a low pass filter 240. Note that the A/D converter 108 can be implemented internal or external to the IF demodulator 110.

The PGA 204 receives the analog IF input signal 107 and variably amplifies the analog input signal 107 according to an automatic gain control (AGC) circuit 210. The A/D converter 108 receives the output of the PGA 204 and digitizes the output of the PGA 204 to generate a digital signal 205. The AGC 210 examines the amplitude of the digital signal 205 to generate a control signal that controls the PGA 204. As such, the PGA 204, the A/D converter 108, and the AGC 210 form an AGC loop that is configured to use the full dynamic range of the A/D converter 108.

The A/D converter 108 is configured to sample the output of the PGA 204 so as to down-convert the output of the PGA 204 to second, and lower, IF signal.

For example, the analog IF picture carrier at 45.75 MHz includes a picture carrier that is recovered by the loop filter 238. In one embodiment, the A/D converter 108 is configured to sample the output of the PGA 204 to produce a digital output signal 205, where the picture carrier is down-converted to 8.25 MHz. In one embodiment, the A/D converter 108 is configured to sub-sample the output of the PGA 204 so as the effect the down-conversion.

The complex digital mixer 206 mixes the digital signal 205 with the output of a direct digital frequency synthesizer (DDFS) 228 to down-convert the digital signal 205 to baseband to produce an IQ baseband output. The direct digital frequency synthesizer 228 provides a quadrature local oscillator output for the complex mixer 206. The complex digital mixer 206 includes a first multiplier 226 and a second multiplier 230 that are driven in quadrature by the output of the DDFS 228. The frequency of the DDFS is selected so that the picture carrier is down-converted to DC. The output of the multiplier 226 can be referred to as the in-phase (I) baseband component, and the output of the multiplier 230 can be referred to as the quadrature (Q) baseband component. The quadrature component is filtered by a lowpass filter 240 and a loop filter 238, where the output of the loop filter 238 controls the frequency of the DDFS 228.

The complex mixer 206, the low pass filter 240, the loop filter 238, and the DDFS 228 form a carrier recovery loop 239 (similar to a phase lock loop) that recovers the picture carrier. In one embodiment, the carrier recovery loop 239 including the loop filter 238 are configured so that the picture carrier at the output of the complex mixer 206 is down-converted to 0 Hz, or DC. More specifically, the output of the loop filter 238 can be viewed as an error signal that corrects the frequency of the DDFS 228 so that the picture carrier in the analog signal 107 is down-converted to DC at the output of the complex mixer 206.

The lowpass filter 232 filters the in-phase baseband output of the multiplier 226. Likewise, the lowpass filter 236 filters the quadrature baseband output of the multiplier 230. The lowpass I and Q baseband signals from the filters 232 and 234 are then sent to the Nyquist filter 234. The Nyquist filter 234 combines the I and Q outputs from the filters 232 and 234 and performs Nyquist shaping that was traditionally done by the SAW filter at the IF frequency, to produce a baseband signal 241. The group delay filter 242 provides for group delay compensations of the baseband signal 241. The audio trap filter 246 removes the audio signal from the baseband signal, leaving only a video signal that is gain adjusted by the gain adjust 248, to produce a digital video signal 252. The order of the group delay filter 242 and the audio trap filter 246 can be swapped. The gain adjust 248 adjusts both the gain by scaling the signal by some multiplication factor, and adjusts the DC level by adding a DC value to the signal. In embodiments, the digital video signal 252 is compatible with CVBS decoding, which includes luminance and chrominance separation.

The second complex mixer 208 receives the output of the first complex mixer 206 to perform audio signal recovery. As discussed above, the carrier recovery loop 239 is configured so that the picture carrier is down-converted to DC. When the picture carrier is at DC, the audio carrier occurs at 4.5 MHz for NTSC. Therefore, the second complex mixer 208 mixes the audio carrier at 4.5 MHz down to 0 Hz or DC. More specifically, the DDFS 216 is configured so that the audio carrier at 4.5 MHz is down-converted to DC. For example, the DDFS 216 can be tuned to the 4.5 MHz so that the audio carrier at the output of the first complex mixer 206 is down-converted directly to DC by the multipliers 214 and 218, producing an IQ baseband signal at the output of the complex mixer 206. The complex mixer 208 generates an IQ baseband signal that is filtered and decimated by the filters 220 and 222 to remove unwanted signals, including the video signal. The FM demodulator 224 receives the complex audio baseband signal and demodulates it to produce digital audio output signal 250 that can be BTSC compatible, or can be mono.

As discussed above, the audio carrier is offset from the picture carrier by 4.5 MHz for NTSC. Other frequency offsets could be possible depending on the standard used. For example, the audio carrier could be offset by 5.5 MHz, 6.0 MHz, and/or 6.5 MHz, or by some other amount. FIG. 3 further illustrates the frequency spectrum of a 6 MHz TV channel 300. The TV channel 300 has a picture carrier 302 at DC (or 0 Hz), and a sound carrier 304 that is offset from the picture carrier 302 by 4.5 MHz. Further details of the TV channel 300 are also included including the picture signal envelope having an upper sideband 306 and a vestigal sideband 308. The I signal 310, Q signal 312, and the color carrier 314 are also shown for completeness.

The audio recovery shown is an open loop system where the DDFS 216 generates a fixed frequency that is near the location of the audio carrier at the output of the first complex mixer. A frequency offset between the output of the DDFS 216 and the audio carrier at the output of the first complex mixer shows up as a DC offset at the output of the FM demodulator, which can be removed using a DC compensation block.

The various filters (e.g. Nyquist filter 234) in the digital IF demodulator 110 are digital filters that can be implemented using fixed coefficients or programmable coefficients. For example, the filters can be implemented with digital signal processors, which add flexibility to design of the demodulator.

Based on the discussion above, the digital IF demodulator 110 includes a video recovery circuit and an audio recovery circuit. The video recovery circuit includes: the complex mixer 206, the carrier recovery loop 239, the lowpass filters 232, 236, the Nyquist filter 234, the group delay filter 242, the audio trap filter 246, and the gain/DC adjust 248, so as to generate the digital video output 252. The audio recovery circuit receives the baseband output of the video recovery circuit (e.g complex mixer 206 output) and recovers the digital audio output using the complex mixer 208, the filter/decimators 220,222, and the FM demodulator 224.

FIG. 4 illustrates a flowchart 400 that further describes the operation of the IF demodulator 110. In step 402, an analog IF signal is received having a video component and an audio component. The analog IF signal can be a TV signal or channel that is down-converted by a TV tuner, such as the tuner 102. An exemplary TV channel is shown in FIG. 3.

In step 404, the analog IF signal is digitized to create a digital IF signal having the video component and the audio component. For example, the A/D converter 108 digitizes the analog IF input 107.

In step 406, a first local oscillator signal is generated so that it can be used for down-conversion of the digital IF signal. For example, the DDFS 228 generates a quadrature local oscillator signal for the complex mixer 206. As discussed below in step 412, the frequency of the first local oscillator is determined so that the picture carrier in the video component of the digital IF signal is down-converted to DC.

In step 408, the digital IF signal is then down-converted to baseband using the first local oscillator signal to generate a baseband signal having a video component and an audio component. For example, the complex mixer 206 down-converts the output of the A/D converter 108 using the quadrature local oscillator signal.

In step 410, a picture carrier is recovered from the video component of the baseband signal. For example, the carrier recovery loop 239 recovers the picture carrier from the baseband output of the complex mixer 206.

In step 412, the frequency of the first local oscillator signal is adjusted, or tuned, so that the picture carrier is down-converted to DC during step 408. For example, the carrier recovery loop 239 adjusts the frequency of the first local oscillator signal generated by the DDFS 228 so that the picture carrier in the output of the complex mixer 206 is down-converted to DC.

In step 414, the video component of the baseband signal is recovered from the baseband signal generated in step 408. For example, the digital video signal 252 is generated by combining and filtering the baseband output of the complex mixer 206, including Nyquist filtering by the Nyquist filter 234.

As discussed above, when the picture carrier is down-converted to DC, then the audio carrier is offset from DC by a frequency offset, for example 4.5 MHz. In step 416, a second local oscillator signal is generated having a frequency that is selected so that the audio carrier in the baseband signal is down-converted to approximately DC. The second local oscillator signal is relatively fixed compared to the first local oscillator signal since the audio carrier is relatively fixed relative to the picture carrier at DC. For example, the DDFS 216 generates a quadrature local oscillator signal having a relatively fixed frequency (e.g. 4.5 MHz) for the complex mixer 208.

In step 418, the audio component in the baseband signal (of step 408) is down-converted using the second local oscillator signal in order to recover the audio component in the baseband signal. For example, the complex mixer 206 down-converts the output of the A/D converter 108 using the quadrature local oscillator signal from the DDFS 216.

In step 420, the audio component is filtered and decimated prior to FM demodulation in step 422. For example, the output of the complex mixer 208 is filtered and FM demodulated to generate the digital audio signal 250.

CONCLUSION

Example embodiments of the methods, systems, and components of the present invention have been described herein. As noted elsewhere, these example embodiments have been described for illustrative purposes only, and are not limiting. Other embodiments are possible and are covered by the invention. Such other embodiments will be apparent to persons skilled in the relevant art(s) based on the teachings contained herein. Thus, the breadth and scope of the present invention should not be limited by any of the above-described exemplary embodiments, but should be defined only in accordance with the following claims and their equivalents.

What is claimed is:

1. A digital IF demodulator, including:
   an analog-to-digital (A/D) converter configured to receive an analog IF signal and generate a digital IF signal;
   a video recovery circuit, including
       a first digital complex mixer coupled to an output of said A/D converter, said first digital complex mixer configured to down-convert said digital IF signal to a baseband signal, said first digital complex mixer having a local oscillator that is tuned to down-convert a picture carrier in said digital IF signal to DC; and
       a Nyquist filter that receives said baseband signal from said first digital complex mixer and is configured to perform Nyquist shaping on said baseband signal, a digital video output derived from an output of said Nyquist filter;
   an audio recovery circuit, including
       a second digital complex mixer coupled to an output of said first digital complex mixer, said second digital complex mixer configured to down-convert an audio component in said baseband signal to an audio baseband signal; and
       a FM demodulator that demodulates said audio baseband signal to generate a digital audio output.

2. The digital IF demodulator of claim 1, wherein said Nyquist filter is configured using a digital signal processor.

3. The digital IF demodulator of claim 1, further comprising:
   a group delay filter coupled to an output of said Nyquist filter;
   an audio trap filter coupled to an output of said group delay filter; and
   a gain level adjust coupled to an output of said audio trap filter, the digital video output taken from said gain level adjust.

4. The digital IF demodulator of claim 1, further comprising:
   a carrier recovery loop that detects said picture carrier in said output of said first complex mixer and tunes said local oscillator so said picture carrier is down-converted to DC.

5. The digital IF demodulator of claim 4, wherein said carrier recovery loop is a feedback loop including:
   a low pass filter that detects a quadrature output of said first complex mixer; and
   a loop filter coupled between an output of said lowpass filter and a control input of said local oscillator.

6. The digital IF demodulator of claim 1, further comprising a pair of lowpass filters coupled between an output of said first complex mixer and an input of said Nyquist filter.

7. The digital IF demodulator of claim 1, wherein said Nyquist filter performs Nyquist shaping of the video signal using said baseband signal.

8. The digital IF demodulator of claim 1, wherein said first complex mixer comprises:
   a first multiplier configured to multiply an in-phase local oscillator signal from said local oscillator with said digital IF signal, said first multiplier producing an in-phase baseband component of said baseband signal; and
   a second multiplier configured to multiply a quadrature local oscillator signal from said local oscillator with said digital IF signal, said second multiplier producing a quadrature baseband component of said baseband signal.

9. The digital IF demodulator of claim 8, wherein said second complex mixer comprises:
   a second local oscillator;
   a third multiplier configured to multiply an in-phase local oscillator signal from said second local oscillator with said in-phase component of said baseband signal, said third multiplier producing an in-phase baseband component of said audio baseband signal; and
   a fourth multiplier configured to multiply a quadrature local oscillator signal from said second local oscillator with a quadrature component of said baseband signal, said fourth multiplier producing a quadrature baseband component of said audio baseband signal.

10. The digital IF demodulator of claim 9, further comprising a pair of digital filters coupled between respective outputs of said third and fourth multipliers and said FM demodulator, said digital filters filtering and decimating said respective in-phase and quadrature baseband components of said audio baseband signal.

11. The digital IF demodulator of claim 9, wherein at least one of said first local oscillator and said second local oscillator is a direct digital frequency synthesizer (DDFS).

12. The digital IF demodulator of claim 1, wherein said local oscillator is a direct digital frequency synthesizer (DDFS).

13. The apparatus of claim 1, further comprising:
   a programmable gain amplifier coupled to an input of said A/D converter and providing said analog IF signal; and
   an automatic gain control circuit that senses an output of said A/D converter and controls a gain of said programmable gain amplifier.

14. The digital IF demodulator of claim 13, wherein a gain of said programmable gain amplifier is determined to use a full dynamic range of said A/D converter.

15. The digital IF demodulator of claim 1, wherein said digital IF demodulator is at least partially disposed on a silicon substrate common to a receiver, according to a Complementary Metal Oxide Semiconductor (CMOS) process.

16. The digital IF demodulator of claim 1, wherein said audio component includes an audio carrier that is offset in frequency from said picture carrier at DC.

17. The digital IF demodulator of claim 16, wherein said audio carrier is offset from said picture carrier by approximately 4.5 MHz.

18. The digital IF demodulator of claim 16, wherein said audio carrier is offset from said picture carrier by approximately 5.5 MHz.

19. The digital IF demodulator of claim 16, wherein said audio carrier is offset from said picture carrier by approximately 6.0 MHz.

20. The digital IF demodulator of claim 16, wherein said audio carrier is offset from said picture carrier by approximately 5.0 MHz.

21. The digital IF demodulator of claim 16, wherein a second local oscillator in said second complex mixer is configured to down-convert said audio carrier to DC.

22. A method of demodulating an analog IF signal having a video component and an audio component, comprising:
    digitizing the analog IF signal to create a digital IF signal having a video component and an audio component;
    generating a local oscillator signal;
    down-converting the digital IF signal using said local oscillator signal to generate a baseband signal having said video component and said audio component;
    recovering a picture carrier from said video component of said baseband signal;
    tuning a frequency of said local oscillator signal so said picture carrier is down-converted to DC during said down-converting step.

23. The method of claim 22, further comprising: recovering said video component of said baseband signal.

24. The method of claim 23, wherein said step of recovering said video component of said baseband signal includes:
    performing Nyquist shaping on said baseband signal,
    compensating for group delay in said baseband signal; and
    removing said audio component from said baseband signal so that only said video component remains.

25. The method of claim 22, wherein said audio component in said baseband signal is offset in frequency from said video component, further comprising:
    generating a second local oscillator signal based on said frequency offset between said video component and said audio component; and
    down-converting said audio component of said baseband signal using said second local oscillator signal to generate an audio baseband signal.

26. The method of claim 25, further comprising:
    filtering and decimating said audio baseband signal; and
    FM demodulating the result of said filtering and decimating step, to produce a digital audio output.

27. The method of claim 25, wherein a frequency of said second local oscillator signal is approximately equal to said frequency offset between said video component and said audio component, and wherein said step of down-converting said audio component includes the step of complex multiplying said baseband signal with said second local oscillator signal.

28. The method of claim 25, wherein at least one of said local oscillator signal and said second local oscillator signal are generated by a direct digital frequency synthesizer.

29. The method of claim 28, wherein said step of generating a local oscillator signal includes the step of generating said local oscillator signal using a direct digital frequency synthesizer, and wherein said step of tuning a frequency of said local oscillator signal includes the step of tuning a control of said direct digital frequency synthesizer.

30. A digital IF demodulator, including:
    an analog-to-digital (A/D) converter that receives an analog IF signal and converts it to a digital IF signal;
    a video recovery circuit that (i) frequency translates said digital IF signal using a local oscillator signal to a baseband signal having a video component and an audio component, and (ii) selects said video component from said baseband signal;
    said video recovery circuit including a feedback loop that detects a picture carrier in said baseband signal and adjusts a frequency of said local oscillator so said picture carrier is translated to approximately DC, and wherein an audio carrier in said baseband signal is offset from DC;
    an audio recovery circuit that (i) receives said baseband signal from said video recovery circuit, and (ii) frequency translates said audio carrier in said baseband signal to DC to recover said audio component in said baseband signal.

31. The digital IF demodulator of claim 30, wherein said video recovery circuit includes (i) a complex mixer that multiplies said digital IF signal with a local oscillator signal, and (ii) a feedback loop that selects said picture carrier and adjusts said local oscillator signal so said picture carrier is translated to DC.

32. The digital IF demodulator of claim 31, wherein said video recovery circuit further includes at least one filter that selects said video component from said baseband signal.

33. The digital IF demodulator of claim 30, wherein said audio recovery circuit includes (i) a complex mixer that multiplies said baseband signal with a local oscillator signal so said audio carrier is down-converted to DC; and (ii) at least one filter that selects said audio component from an output of said complex mixer.

34. The digital IF demodulator of claim 1, further comprising a filter coupled to an input of said AID converter, said filter being capable of processing both an analog television signal and a digital television signal.

35. The digital IF demodulator of claim 34, wherein said filter is a surface acoustic wave filter.

36. The digital IF demodulator of claim 34, wherein said analog television signal is an National Television Standards Committee (NTSC) signal.

37. The digital IF demodulator of claim 34, wherein said analog television signal is a Phase Alternation Line (PAL) signal.

38. The digital IF demodulator of claim 34, wherein said analog television signal is a Systeme Electronique Couleur Avec Memoire (SECAM) signal.

39. The digital IF demodulator of claim 16, wherein said audio carrier is offset between 4.5 and 6.0 MHz from said picture carrier.

* * * * *